United States Patent
Hsu et al.

(10) Patent No.: US 9,431,256 B2
(45) Date of Patent: Aug. 30, 2016

(54) SEMICONDUCTOR DEVICE AND MANUFACTURING METHOD THEREOF

(71) Applicant: UNITED MICROELECTRONICS CORP., Hsin-Chu (TW)

(72) Inventors: Cheng-Yuan Hsu, Hsinchu (TW); Zhen Chen, Singapore (SG); Chi Ren, Singapore (SG); Ching-Long Tsai, Taipei (TW); Wei Cheng, Singapore (SG); Ping Liu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 35 days.

(21) Appl. No.: 13/939,186

(22) Filed: Jul. 11, 2013

(65) Prior Publication Data

US 2015/0014761 A1    Jan. 15, 2015

(51) Int. Cl.

| | |
|---|---|
| H01L 29/423 | (2006.01) |
| H01L 21/28 | (2006.01) |
| H01L 29/66 | (2006.01) |
| H01L 29/788 | (2006.01) |
| H01L 27/115 | (2006.01) |

(52) U.S. Cl.
CPC ... *H01L 21/28273* (2013.01); *H01L 27/11521* (2013.01); *H01L 29/42328* (2013.01); *H01L 29/66825* (2013.01); *H01L 29/7881* (2013.01)

(58) Field of Classification Search
None
See application file for complete search history.

(56) References Cited

U.S. PATENT DOCUMENTS

| | | | | |
|---|---|---|---|---|
| 6,091,104 A | * | 7/2000 | Chen | 257/326 |
| 6,563,167 B2 | * | 5/2003 | Chern | H01L 29/42324 257/316 |
| 6,767,792 B1 | * | 7/2004 | Wen et al. | 438/257 |
| 6,784,039 B2 | * | 8/2004 | Hsieh | H01L 27/11521 257/315 |
| 8,669,607 B1 | * | 3/2014 | Tsair et al. | 257/316 |
| 2008/0049517 A1 | * | 2/2008 | Hung | G11C 16/0433 365/185.28 |
| 2010/0054043 A1 | * | 3/2010 | Liu et al. | 365/185.29 |
| 2011/0006355 A1 | * | 1/2011 | Shen et al. | 257/316 |
| 2014/0126299 A1 | * | 5/2014 | Fukumoto | 365/185.33 |
| 2016/0035576 A1 | * | 2/2016 | Bell | H01L 21/28273 257/326 |

FOREIGN PATENT DOCUMENTS

JP    2012-245826    * 11/2012

* cited by examiner

*Primary Examiner* — Benjamin Sandvik
(74) *Attorney, Agent, or Firm* — Winston Hsu; Scott Margo

(57) ABSTRACT

A method for manufacturing a semiconductor device includes the following steps. At first, two gate stack layers are formed on a semiconductor substrate, wherein each of the gate stack layers includes a top surface and two side surfaces. A conductive material layer is deposited to conformally cover the top surface and the two side surfaces of each of the gate stack layers. Then, a cap layer is deposited to conformally cover the conductive material layer. Finally, the cap layer and the conductive material layer above the top surface of each of the gate stack layers are removed to leave the cap layer adjacent to the two side surfaces of each of the gate stack layers and covering a portion of the conductive material layer.

7 Claims, 4 Drawing Sheets

US 9,431,256 B2

SEMICONDUCTOR DEVICE AND MANUFACTURING METHOD THEREOF

BACKGROUND OF THE INVENTION

1. Field of the Invention

The present invention generally relates to the field of semiconductor technology, and more particularly to a semiconductor device and a manufacturing method thereof.

2. Description of the Prior Art

A flash memory is a non-volatile memory, which can preserve data within the memory even when an external power supply is off. Recently, since flash memories are re-writable and re-erasable, they have been widely utilized in the fabrication of electrical products, such as mobile phones, digital cameras, video players, personal digital assistants (PDA) or systems on a chip (SOC).

Please refer to FIG. 1, which is a cross sectional diagram illustrating a conventional flash memory cell. As shown in FIG. 1, a flash memory cell 10 includes a semiconductor substrate 60, two stack gates 12, two select gates 20$a$/20$b$ and an erase gate 22. Both of the stack gates 12 are disposed on the semiconductor substrate 12. The select gates 20$a$/20$b$ are respectively disposed at one side of the stack gates 12, while the erase gate 22 is disposed between the two adjacent stack gates 12. More precisely, each of the stack gates 12 includes at least a floating gate 16 and a control gate 18 stacked from bottom to top. The floating gate 16, the control gate 18 and the select gate 20$a$/20$b$ are commonly made of polysilicon, and dielectric layers 24/26/28 such as oxide layers may be respectively disposed between the two adjacent gates for electrical insulation. The dielectric layers 24 disposed between the floating gate 16 and the semiconductor substrate 60 may serve as a tunneling oxide, through which the hot electrons may get in or out of, thereby achieving data accessing. The flash memory cell 10 may further include source/drain regions 30/32/34 disposed in the semiconductor substrate 60 at two sides of the stack gates 12, and include channel regions (not shown) defined in the semiconductor substrate 60 between the two adjacent source/drain regions 30/32/34. When the flash memory cell 10 is operating, portions of the electrons moving in the channel regions may be injected into the floating gate 16 by applying suitable positive voltage to the control gate 18 thereby achieving data accessing.

In the manufacturing process for the conventional flash memory cell 10, a conductive material made of polysilicon (not shown) is usually deposited on the semiconductor substrate 60 to completely cover the stack gates 12 and the space therebetween. Afterwards, a planarization and an etching back process may be carried out to remove upper portions of the conductive material and expose the stack gates 12. In a next step, a photolithographic process and an etching process may be performed to pattern the remaining conductive material. As a result, a main structure of the conventional flash memory cell 10 is obtained. In this structure, the conductive material on the inner sides of the stack gates 12 (i.e. between the two stack gates) may serve as an erase gate 22, while the conductive material outside the stack gates 12 may serve as select gates 20$a$/20$b$.

However, with the continuous reduction in the size of the conventional flash memory cells, even though the conductive material is planarized through the above-mentioned planarization process, the thickness of the conductive material within different regions is still uneven. Besides, the etching back process often damages the dielectric layer 28 on the side surfaces of the control gate 18 and degrades the performance of the flash memory cell 10. Furthermore, since a misalignment often occurs during the photolithographic process, this phenomenon causes a large variation in the width W1/W2 of the select gates 20$a$/20$b$ and further influences the channel length underneath the select gates 20$a$/20$b$. Such variation in the channel length under the erase gates 20$a$/20$b$ reduces the reliability of the flash memory cell 10. Consequently, how to avoid the variation in the erase gates is still an important issue in the field, in order to improve the performances of the flash memory cell.

SUMMARY OF THE INVENTION

One object of the present invention is therefore to provide a method for fabricating a semiconductor device in order to avoid the above-described drawbacks.

According to one exemplary embodiment of the present invention, a method for manufacturing a semiconductor device is provided and includes the following steps. At first, two gate stack layers are formed on a semiconductor substrate, wherein each of the gate stack layers includes a top surface and two side surfaces. A conductive material layer is deposited to conformally cover the top surface and the two side surfaces of each of the gate stack layers. Then, a cap layer is deposited to conformally cover the conductive material layer. Finally, the cap layer and the conductive material layer above the top surface of each of the gate stack layers are removed to leave the cap layer adjacent to the two side surfaces of each of the gate stack layers covering a portion of the conductive material layer.

According to another exemplary embodiment of the present invention, a semiconductor device is provided. The semiconductor device includes at least two gate stack layers and two conductive structures. The two gate stack layers are disposed on a semiconductor substrate, wherein each of the gate stack layers comprises a first side surface and a second side surface opposite to the first side surface. The two conductive structures with the same width are respectively disposed on the first side surfaces, wherein each of the conductive structures comprises a vertical surface.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
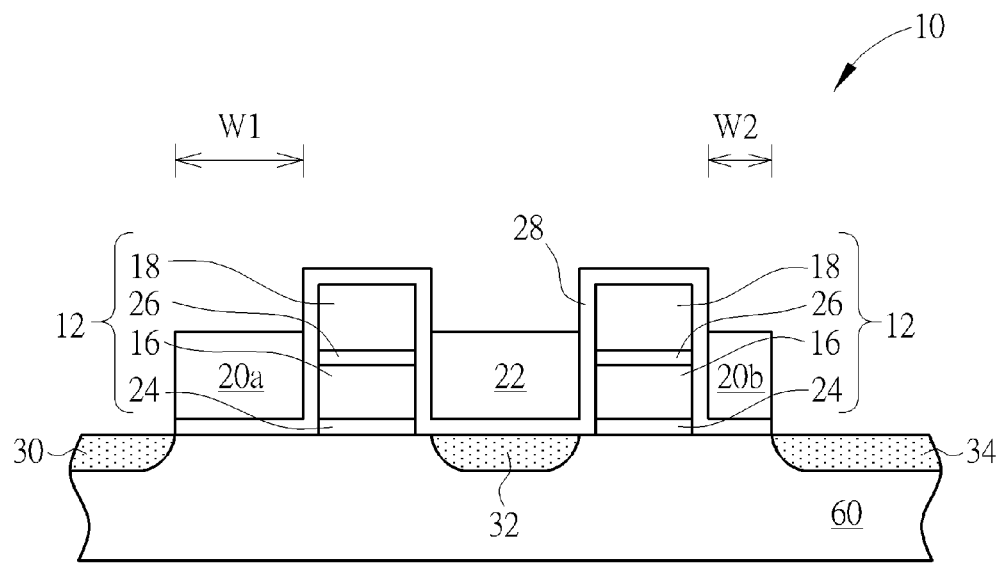
FIG. 1 is a cross sectional diagram illustrating a conventional flash memory cell.
Figure 2:
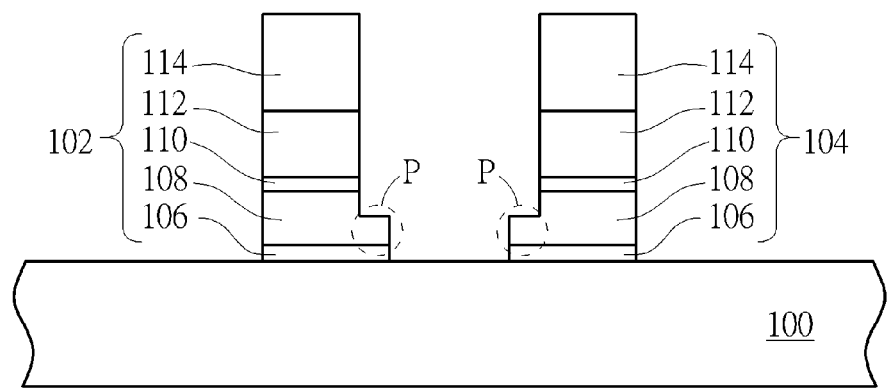
FIG. 2 through FIG. 6 are schematic diagrams illustrating a method for fabricating a semiconductor device according to a preferred exemplary embodiment of the present invention.

The present invention provides a method for fabricating a semiconductor device. Please refer to FIG. 2 through FIG. 6, which are schematic diagrams illustrating a method for fabricating a semiconductor device according to a preferred exemplary embodiment of the present invention. As shown in FIG. 2, two gate stack layers 102/104 are formed on a semiconductor substrate 100. Each of the gate stack layers 102/104 includes at least a gate layer and at least a dielectric layer. In this exemplary embodiment, each of the gate stack layers 102/104 includes a first dielectric layer 106, a first gate layer 108, a second dielectric layer 110, a second gate layer 112 and a patterned mask layer 114 disposed sequentially on the semiconductor substrate 100. Basically, the gate stack layers 102/104 have the same height and the same width, but not limited thereto.

The method for forming the two gate stack layers 102/104 includes the following steps. At first, a patterned stack layer (not shown) including a first dielectric layer (not shown) and a first gate layer (not shown) is formed within a predetermined region on the semiconductor substrate 100. The predetermined region may be defined by electrical isolation regions, such as shallow trench isolation (STI), in order to insulate adjacent active regions from one another, but not limited thereto. Then, a second dielectric layer (not shown), a second gate layer (not shown) and a mask layer (not shown) are disposed sequentially on the semiconductor substrate 100 to cover the patterned stack layer.

In this exemplary embodiment, the semiconductor substrate 100 may include a Si substrate, a GaAs substrate, a silicon-on-insulator (SOI) substrate, a compound semiconductor-on-silicon substrate or other suitable substrates. Besides, the dielectric layers may be formed through a thermal oxidation process or a deposition process such as chemical vapor deposition (CVD) process or atomic layer deposition (ALD) process. The dielectric layers may be respectively a single-layered structure or a multi-layered structure made of insulating materials such as silicon oxide, silicon oxynitride, or other high-k gate dielectric layers with a dielectric constant larger than 4. The gate layer may be formed through low pressure chemical vapor deposition (LPCVD) process and the composition of which may be chosen from conductive materials such as polysilicon, metal silicide or metal layer with specific work function. The mask layer is made of silicon nitride formed through a chemical vapor deposition (CVD) process, but not limited thereto.

In a next step, a patterned photoresist layer (not shown) is formed on the stack layer through a photoresist coating process and a photolithographic process. Then, an etching process, such as an isotropic etching process, is performed by using the patterned photoresist layer as an etching mask such that the pattern in the patterned photoresist layer may be transferred to the underlying mask layer. Subsequently, the patterned photoresist layer is removed optionally. Afterwards, another etching process is carried out. During this etching process, the pattern defined in the mask layer may be further transferred down to the second gate layer, the second dielectric layer and a portion of the first gate layer sequentially so as to form as structure shown in FIG. 2. In this exemplary embodiment, the gate stack layers 102/104 shown in FIG. 2 are mirror symmetric to each other.

More precisely, each of the gate stack layers 102/104 may include the first dielectric layer 106, the first gate layer 108, the second dielectric layer 110, the second gate layer 112 and the patterned mask layer 114 disposed sequentially on the semiconductor substrate 100. In this exemplary embodiment, the first dielectric layer 106 may serve as a tunneling oxide, the first gate layer 108 may serve as a floating gate, the second dielectric layer 110 may serve as an inter-gate dielectric, and the second gate layer 112 may serve as a control gate. The first gate layer 108 could be also made of materials such as silicon nitride in order to trap charges. It should be noted that, since the first dielectric layer and the first gate layer have already been patterned before the deposition of the second dielectric layer, the second gate layer and the mask layer, the first gate layer 108 disclosed in this exemplary embodiment preferably includes a protruding portion P, but not limited thereto.

Figure 3:
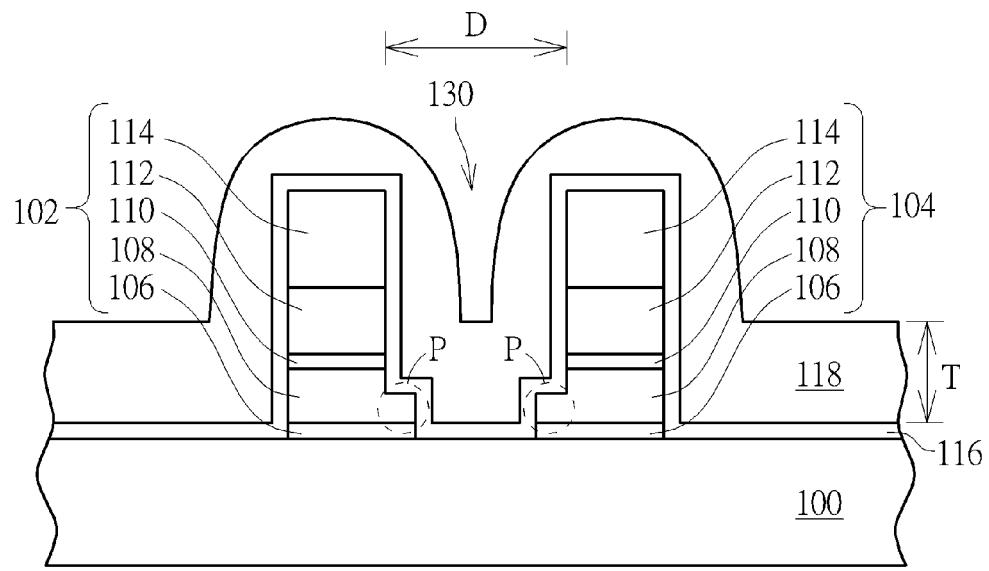

Please refer to FIG. 3. In a next step, a dielectric layer 116 is conformally formed on the semiconductor substrate 100 to cover the top and the side surfaces of the gate stack layers 102/104 and the protruding portions P. More precisely, the method of forming the dielectric layer 116 may include performing a thermal oxidation process to oxidize the exposed surfaces of the gate stack layers 102/104 and the exposed semiconductor substrate 100, or performing a chemical vapor deposition process to form the dielectric layer 116 made of silicon oxide. Additionally, the dielectric layer 116 may be a single-layered structure or a multi-layered structure made of insulating materials such as silicon oxide, silicon oxynitride, or other high-k gate dielectric layers with a dielectric constant larger than 4. Also, the dielectric layer 116 may be a triple-layered structure composed of silicon oxide-silicon nitride-silicon oxide (ONO).

Figure 4:
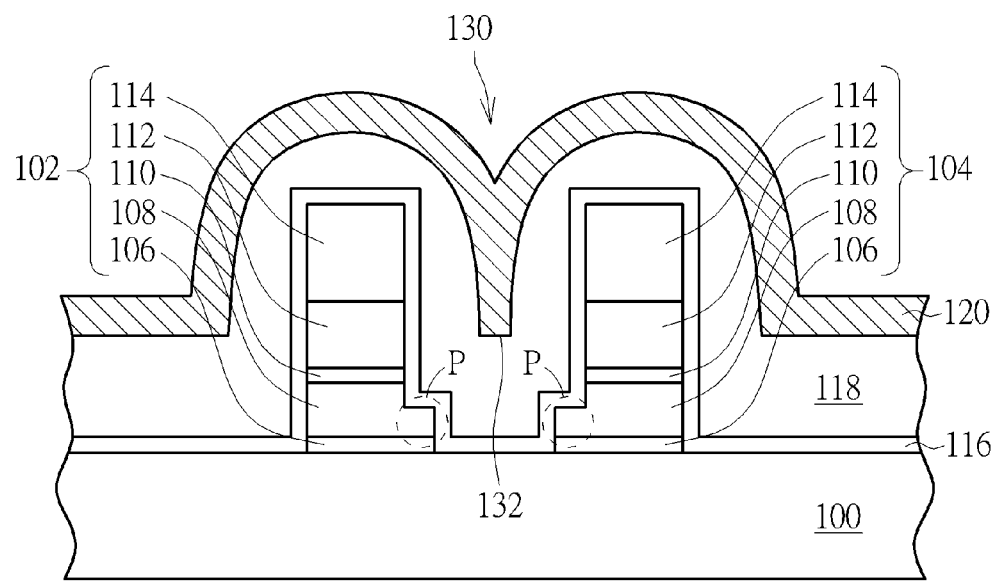

Please refer to FIG. 3 and FIG. 4. A conductive material layer 118 with a proper thickness is conformally formed on the dielectric layer 116 to cover the gate stack layers 102/104 and fill a space between them. The composition of the conductive material layer 118 may include polysilicon, metal silicide or other metal materials with a suitable work function. More precisely, since the spacing D between the two adjacent gate stack layers 102/104 is continuously reduced with the progress in the semiconductor industry, the morphology of the conductive material layer 118 may correspondingly vary slightly even though the conductive material layer 118 is deposited with the same thickness.

In one example, as shown in FIG. 3, when portions of the conductive material layer 118 with respect to each of the gate stack layers 102/104 are apart from each other, the conductive material layer 118 between the two adjacent gate stack layers 102/104 may be independent (not merged together) and a trench 130 with a planar bottom surface 132 may be formed. Preferably, in this case, when the spacing D between the two adjacent gate stack layers 102/104 ranges from 600 Angstroms to 2600 Angstroms, the thickness T of the conductive material layer 118 may range from 250 Angstroms to 1250 Angstroms, but not limited thereto.

It should be noted that, the conductive material layer 118 has a concavo-convex contour and the bottom surface 132 of the trench 130 is preferably located between the top surface and the bottom surface of the gate stack layers 102/104, and more preferably located between the top surface and the bottom surface of the second gate layer 112, but not limited thereto.

Then, please refer to FIG. 4. A cap layer 120 is uniformly and conformally formed on the conductive material layer 118 and merged between the gate stack layers 102/104. In other words, the cap layer 120 may be filled into the trench 130 and in direct contact with the bottom surface 132 of the trench 130, but not limited thereto. In this exemplary embodiment, the bottom of the cap layer 120 is preferably shallower than the bottom surface of the second gate layer 112, but not limited thereto. Furthermore, since the cap layer 120 disclosed in the present embodiment may serve as an etch mask during the subsequent process for etching the underneath conductive material layer 118, a proper etching selectivity is required between them. In order to meet this requirement, the composition of the cap layer 120 is preferably different from that of the conductive material layer 118. For example, the cap layer 120 may include silicon nitride and/or silicon oxide.

Figure 5:
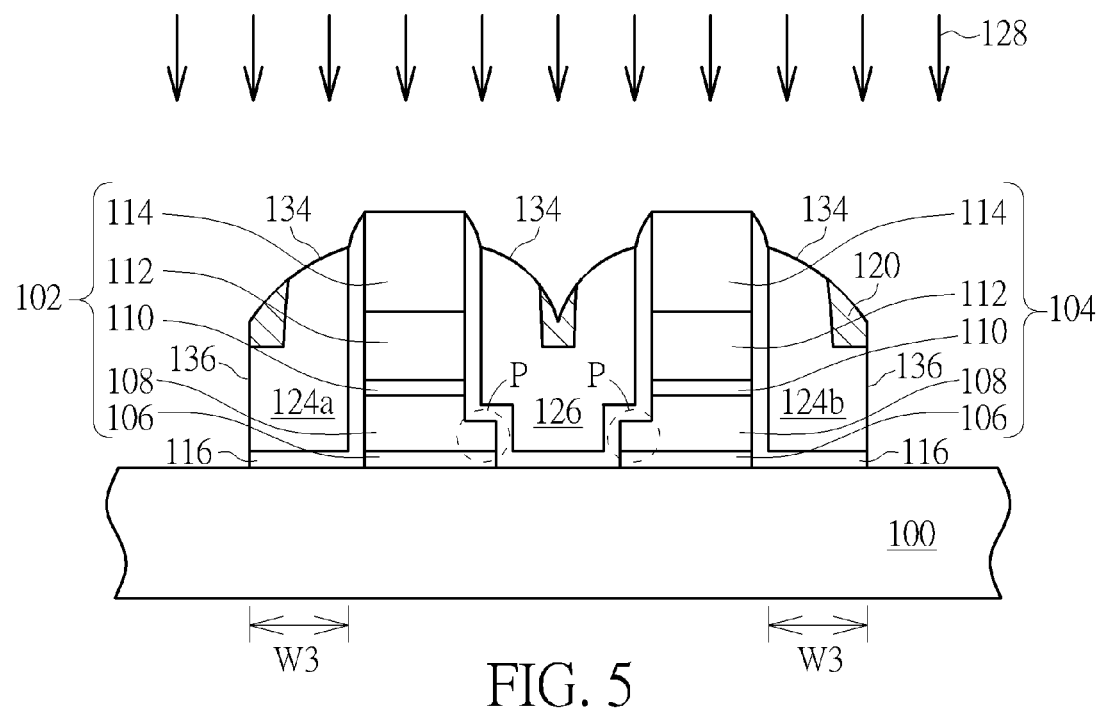

Please refer to FIG. 5. An etching process 128 is carried out to sequentially remove portions of the cap layer 120, the conductive material layer 118 and the dielectric layer 116 until portions of the patterned mask layer 114 are exposed. The etching process 128 is preferably an anisotropic etching process, such as a reactive-ion-etching (RIE) process, but not limited thereto. Since there is a suitable etching selectivity between the conductive material layer 118 and the cap layer 120 (the etching selectivity of the conductive material layer 118 to the cap layer 120 is preferably higher than 5), portions of the conductive material layer 118 may still remain after the etching process. Through this etching process, first conductive structures 124a/124b are formed at two sides of the gate stack layers 102/104 and a second conductive structure 126 is formed between two adjacent gate stack layers 102/104. In addition, a portion of the first conductive structures 124a/124b and the second conductive structure 126 may be covered by the etched cap layer 120. In other words, the etched cap layer 120 is discretely disposed over the semiconductor substrate 100 when the etching process is completed. In detail, portions of the etched cap layer 120 fill up the trench, and other portions of the etched cap layer 120 are disposed on the conductive structures 126.

More precisely, through this etching process 128, the top surface 134 of the first conductive structures 124a/124b and the second conductive structure 126 is lower than the top surface of the patterned mask layers 114. Besides, the external surfaces 136 of the first conductive structures 124a/124b are substantially vertical surfaces. In the following processes, each of the first conductive structures 124a/124b may serve as a select gate respectively disposed at an outer side of each of the gate stack layers 102/104; while the second conductive structure 126 may serve as an erase gate disposed between the gate stack layers 102/104. In addition, the dielectric layer 116 located between the first conductive structures 124a/124b and the gate stack layers 102/104 may serve as a inter-gate dielectric so as to electrically isolate the first conductive structures 124a/124b and the second conductive structure 126 from the first gate layers 108 and the second gate layers 112.

One feature of the present invention is that the L-shaped first conductive structures 124a/124b and the U-shaped second conductive structure 126 are formed through a self-aligned process. In this way, all the first conductive structures 124a/124b may be formed with the same width W3 and height H3 and the variation in the channel length underneath the first conductive structures 124a/124b is prevented. Besides, since the dielectric layer 116 on two sides of the first gate layer 108 and the second gate layer 112 is almost entirely covered by the conductive material layer 118, the dielectric layer 116 is not damaged by the etchants during the etching process.

Figure 6:
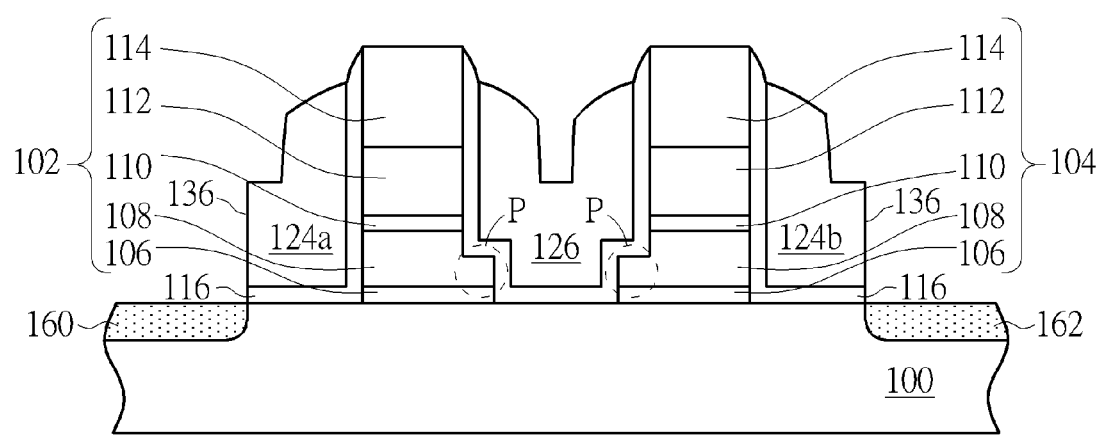

Please refer to FIG. 6. The cap layer (not shown) is then removed through a wet etching process. Afterwards, an ion implantation process is carried out to form source/drain regions 160/162 in the semiconductor substrate 100 at the sides of the first conductive structures 124a/124b or to adjust the conductance of the first conductive structures 124a/124b. Optionally, the source/drain region may be formed in the semiconductor substrate 100 under the second conductive structure 126 at the beginning of the fabrication process. In this structure, the semiconductor substrate 100 contiguous to the first conductive structures 124a/124b and the gate stack layers 102/104 may serve as channel regions for charge carriers.

In the following paragraph, a modification embodiment is disclosed and the description below is mainly focused on differences among each embodiment. In addition, like or similar features will usually be described with same reference numerals for ease of illustration and description thereof.

Figure 7:
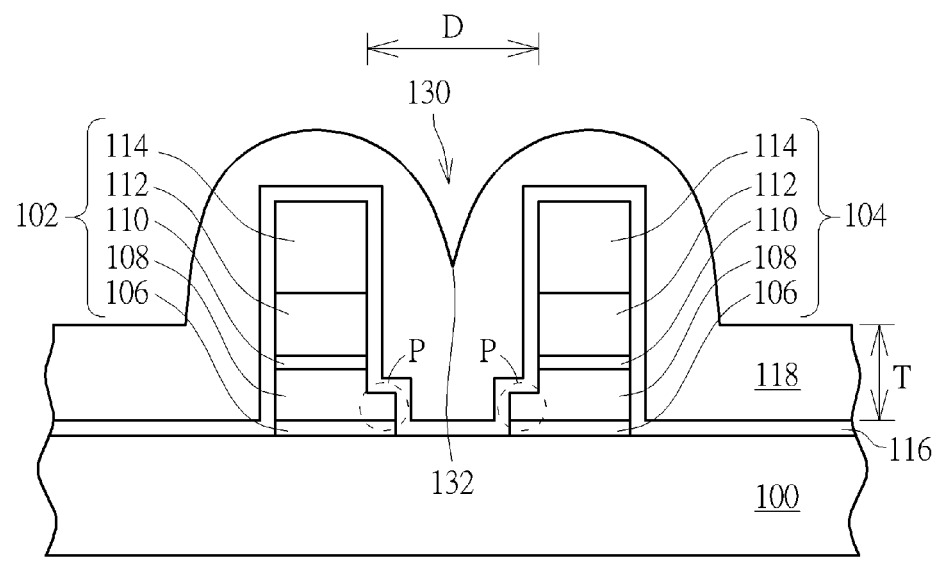
FIG. 7 and FIG. 8 are schematic diagrams illustrating a method for fabricating a semiconductor device according to another preferred exemplary embodiment of the present invention.

Please refer to FIG. 7. The structure and fabrication stage shown in FIG. 7 according to this modification embodiment corresponds to that shown in FIG. 3. One main difference between this modification embodiment and the previous exemplary embodiment is that the conductive material layer 118 is merged together between the two adjacent gate stack layers 102/104 and a trench 130 with a sharp bottom surface 132 may be formed. More precisely, the spacing D between the two adjacent gate stack layers 102/104 may be the same as that disclosed in the previous case, but the thickness T of the conductive material layer 118 preferably ranges from 350 Angstroms to 1350 Angstroms, but not limited thereto.

The conductive material layer 118 according to this embodiment also has a concavo-convex contour and the bottom surface 132 of the trench 130 is preferably located between the top surface and the bottom surface of the gate stack layers 102/104, and more preferably located between the top surface and the bottom surface of the second gate layer 112, but not limited thereto.

Figure 8:
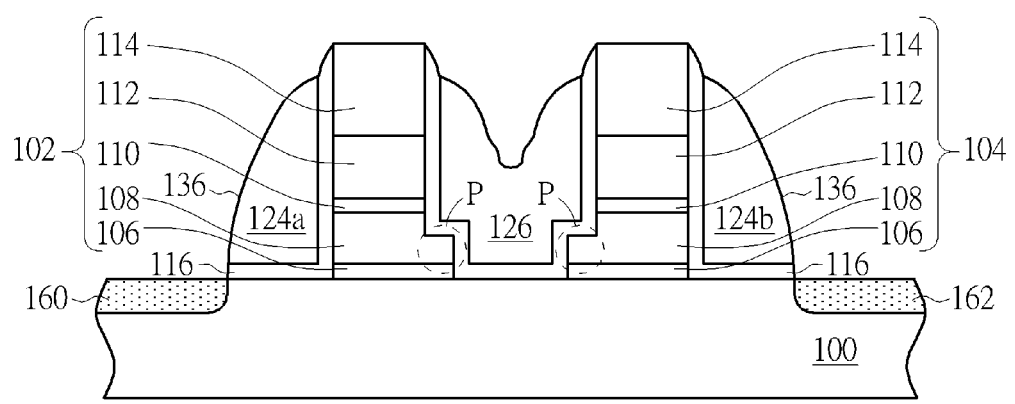

Please refer to FIG. 8. An anisotropic etching process may be carried out to pattern the conductive material layer 118. Due to the existence of the protruding portions P, the conductive material layer 118 in the middle between the gate stack layers 102/104 becomes relatively thick compared with the situation without the protruding portions P. In this way, the second conductive structure 126 similar to that shown in FIG. 6 can be formed during the anisotropic etching process. In this medication embodiment, the first conductive structures 124a/124b and the second conductive structure 126 are also formed through the self-aligned process. Afterwards, the ion implantation process is carried out to form source/drain regions 160/162 in the semiconductor substrate 100 similar to that described in FIG. 6. Since the following procedures are similar to that described in the previous exemplary embodiment, these similar procedures, configurations and properties are therefore not disclosed in detail for the sake of brevity.

To summarize, through sequentially stacking the conductive material layer and the optional cap layer on the gate stack layer and through properly adjusting the thickness of the conductive material layer and the cap layer, the cap layer may merge within a region between the two adjacent gate stack layers. In this way, portions of the conductive material layer between the two adjacent gate stack layers are protected by the cap layer and are not removed excessively during the etching process. In addition, since the first conductive structures are formed through a self-aligned process, any misalignment resulting from the photolithographic process is avoided. Accordingly, the performances of the semiconductor device are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
two gate stack layers, disposed on a semiconductor substrate, wherein each of the gate stack layers comprises a first side and a second side opposite to the first side, and each gate stack layer comprises a first gate layer and a second gate layer, the first gate layer is an L-shaped structure;
two conductive structures with a same width, respectively disposed at the first side, wherein each of the conductive structures comprises a vertical surface and a bottom surface;
two L-shaped dielectric layers disposed at the first side respectively, wherein each L-shaped dielectric layer contacts one of the gate stack layers and one of the bottom surfaces of the conductive structures directly;
another conductive structure disposed between the two gate stack layers;
a trench disposed within the another conductive structure, wherein the trench has a planar bottom surface; and
a cap layer discretely disposed over the semiconductor substrate, wherein portions of the cap layer fill up the trench and other portions of the cap layer are disposed on the conductive structures, and top surfaces of the conductive structures respectively disposed at the first sides are exposed from the cap layer.

2. The semiconductor device according to claim 1, wherein the two gate stack layers are mirror symmetric to each other.

3. The semiconductor device according to claim 1, wherein each of the gate stack layers further comprises a protruding portions at the second side.

4. The semiconductor device according to claim 1, wherein the another conductive structure has a U shape.

5. The semiconductor device according to claim 1, wherein the bottom surface of the trench is below a top surface of each of the gate stack layers.

6. The semiconductor device according to claim 1, wherein each of the conductive structures has an L shape.

7. The semiconductor device according to claim 1, wherein each of the gate stack layers comprises two gate layers and two dielectric layers.

* * * * *